United States Patent [19]
Sakakura et al.

[11] Patent Number: 5,396,173
[45] Date of Patent: Mar. 7, 1995

[54] RF MAGNETIC SHIELD FOR MRI

[75] Inventors: Yoshitomo Sakakura, Somerville, Mass.; Motoji Haragashira, Tochigi; Toru Segawa, Utsunomiya, both of Japan

[73] Assignee: Kabushiki Kaisha Toshiba, Kawasaki, Japan

[21] Appl. No.: 45,979

[22] Filed: Apr. 9, 1993

[30] Foreign Application Priority Data

Apr. 9, 1992 [JP] Japan ............................... 4-089004

[51] Int. Cl.⁶ ........................................... G01R 33/28
[52] U.S. Cl. ................................... 324/318; 335/301
[58] Field of Search ............... 324/318, 300, 322, 314, 324/312; 335/299–301

[56] References Cited

U.S. PATENT DOCUMENTS

| | | | |
|---|---|---|---|
| 4,642,569 | 2/1987 | Hayes et al. | 324/318 |
| 4,751,464 | 6/1988 | Bridges | 324/318 |
| 4,785,246 | 11/1988 | Sugimoto | 324/318 |
| 4,871,969 | 10/1989 | Roemer et al. | 324/318 |
| 4,879,515 | 11/1989 | Roemer et al. | 324/318 |
| 5,028,872 | 7/1991 | Nakabayashi | 324/318 |
| 5,053,711 | 10/1991 | Hayes et al. | 324/318 |
| 5,243,286 | 9/1993 | Rzedzian et al. | 324/318 |

OTHER PUBLICATIONS

"Snapshot Imaging at 0.5 T Using Echo–Planar Techniques," R. J. Ordidge et al., Magnetic Resonance in Medicine, vol. 10, pp. 227–240 (1989).

"Shield for Decoupling rf and Gradient Coils in an NMR Apparatus," K. Yoda, Japanese Journal of Magnetic Resonance in Medicine, vol. 9, No. 1, pp. 86–89 (1989).

"A method of removing noise from electronic devices," S. Nitta, pp. 69–72, 197–200 (1986).

Primary Examiner—Sandra L. O'Shea
Assistant Examiner—Raymond Y. Mah
Attorney, Agent, or Firm—Limbach & Limbach

[57] ABSTRACT

Disclosed is an RF magnetic shield for magnetic resonance imaging apparatus having a gradient coil and an RF coil allocated in a generally cylindrical magnet of the apparatus. The RF magnetic shield comprises conductive shielding plate members, disposed between the gradient coil and the RF coil, through which long slits are formed, and capacitors connected to both the longitudinal ends of the slits, respectively. Each of the capacitors consists of a multilayer capacitor, which is a larger capacitance and is continuously and electrically connected to both the longitudinal ends of the respective slits.

15 Claims, 6 Drawing Sheets

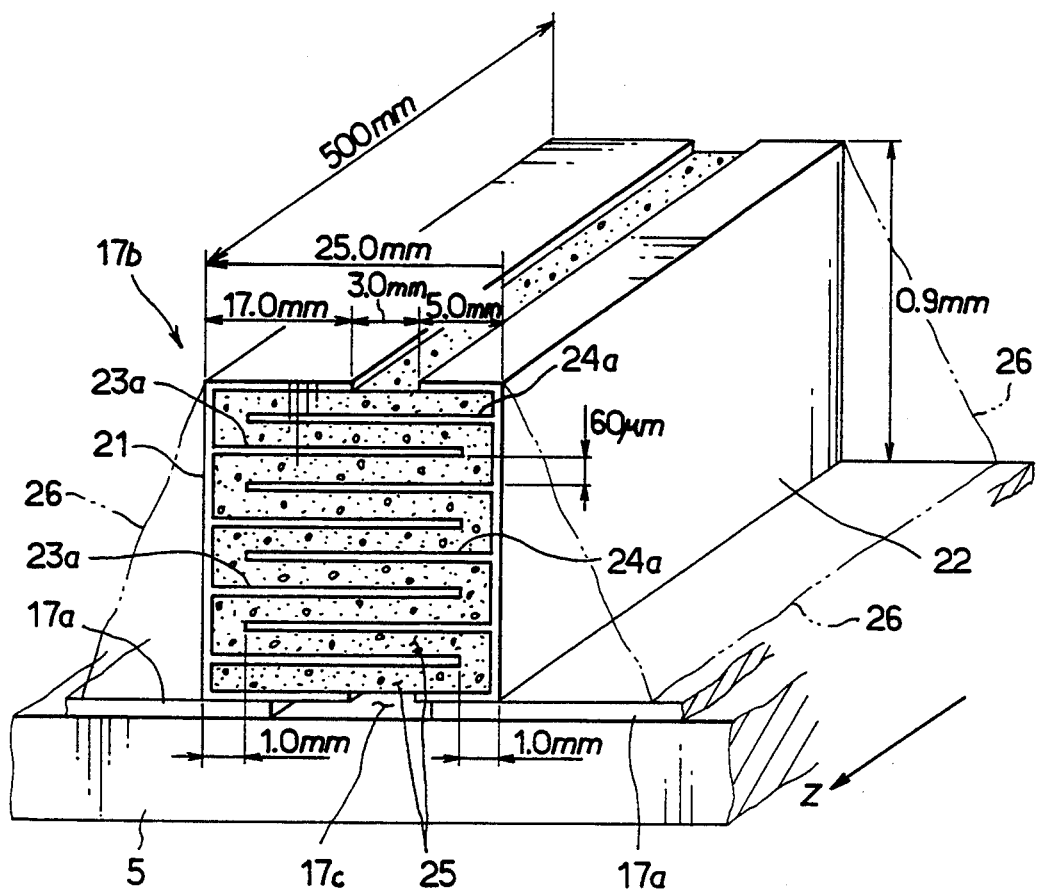
F I G. 7
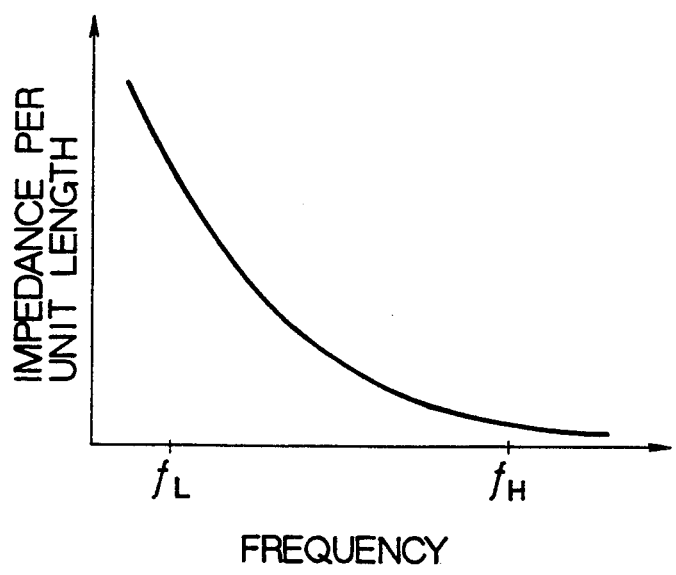
F I G. 8

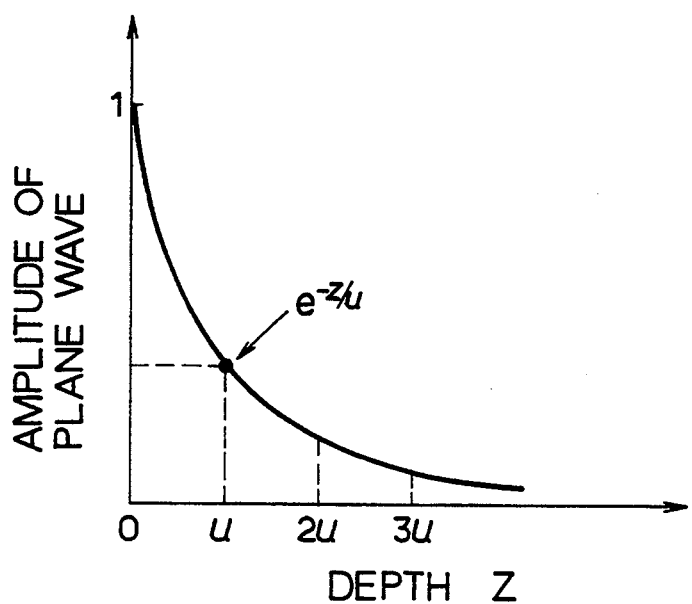
F I G. 9
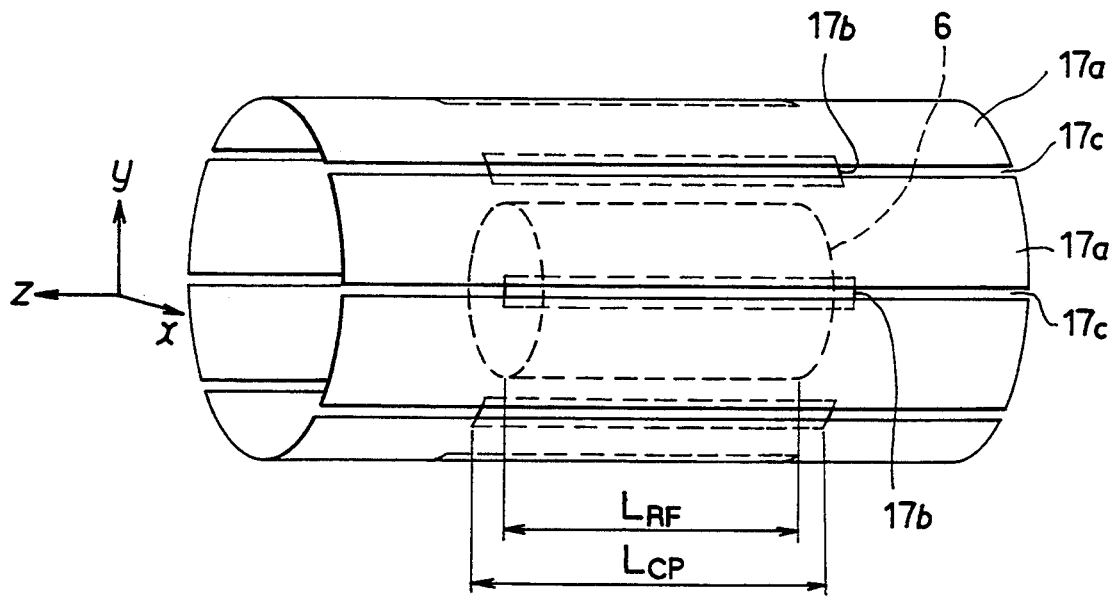
F I G. 10

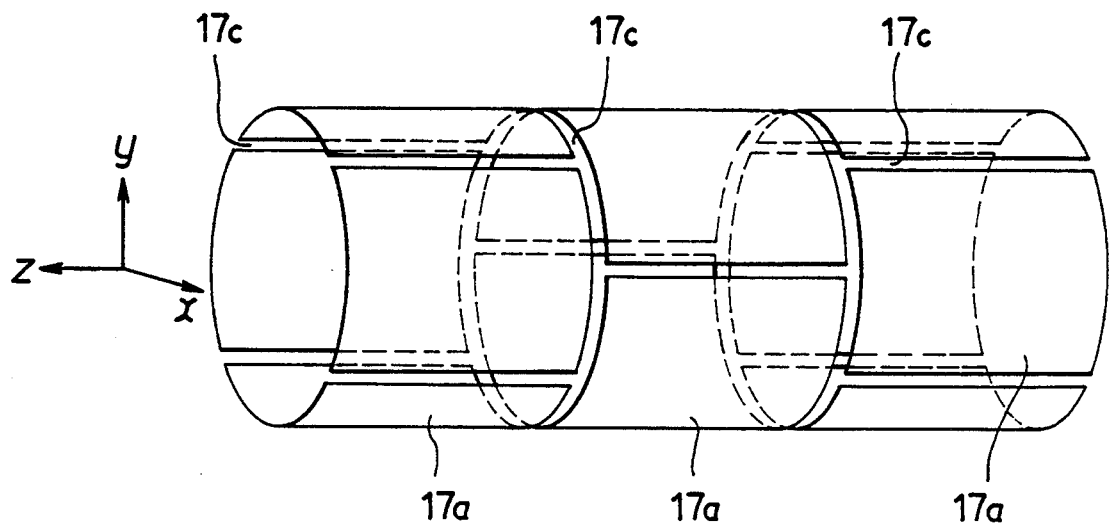
F I G. 11
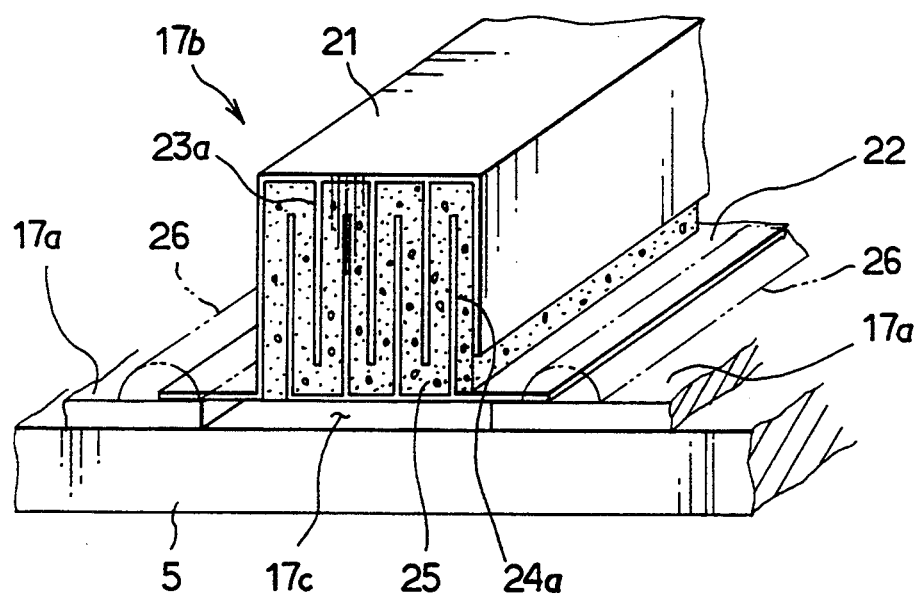
F I G. 12

RF MAGNETIC SHIELD FOR MRI

BACKGROUND OF THE INVENTION

The present invention relates to a radio frequency (RF) magnetic shield for magnetic resonance imaging (MRI) disposed between gradient coils and an RF coil in an MRI apparatus, and more particularly to the shield having a cylindrical conductive plate in which slits are formed for preventing eddy currents due to gradient fields from occurring and the respective slits are electrically connected through capacitors for maintaining the high effect of RF magnetic shielding.

A typical MRI apparatus has an allocation of coils shown in FIG. 1. The MRI apparatus shown therein adopts a superconductive magnet 1 having a cylindrical cryostat 2. A superconductive main coil 3 is disposed in the cryostat 2. In a bore of the cryostat 2, there disposed are a shim coil 4, a gradient coil 5, and an RF coil 6 which are arranged in this order from the inner wall. A cylindrical RF magnetic shield 7, which is made of copper foil, is disposed between the gradient coil 5 and the RF coil 6, with the shield 7 attached to the inner wall of the gradient coil 5.

The above RF magnetic shield 7 should satisfy three requirements. The first is to shield the RF coil 6 from RF noises transmitting through the gradient coil 5. Here, noises at resonance frequencies such as around 63.9 MHz (for magnetic strength of 1.5 tesla) are our interest (in particular, their magnetic components) and are regarded as the RF noises. Second, it is required that magnetic coupling between the gradient coil 5 and the RF coil 6 be removed to prevent a value of Q of the RF coil 6 from being lowered. These first and second requirements should be satisfied by a conductive, non-magnetic metal plate having larger shielding area and having no holes or the like therethrough.

Third, it is required for the shield 7 that, when a gradient field is generated from the gradient coil 5, eddy currents of lower frequencies (approx. tens of kHz or less) induced in the shield 7 by the gradient field be suppressed to remove image distortion resulted from rounded wave forms of the gradient field. In order to prevent the lower frequency eddy currents from generating, the RF magnetic shield 7 has a plurality of slits through its copper foil which are spaced to each other and are shaped into appropriate given sizes.

However, the slits for getting rid of the eddy currents of the lower frequencies degrade the RF shielding effect for the foregoing first and second requirements, since eddy currents of higher frequencies, different from the above lower frequency ones and used to offset the magnetic field of the RF noises (63.9 MHz, for instance) by generating a magnetic field in an opposite direction, are weakend by the slits lying against their flow passes. In short, the first and second requirements are in conflict with the third requirements in regard to satisfying them at the same time. Therefore, it had been long felt that another measure for satisfying the first to third requirements at the same time were required.

For this purpose, a technique shown in FIG. 2 is proposed (refer to "Shield for Decoupling rf and Gradient Coils in an NMR Apparatus" by K. Yoda, Japanese Journal of Magnetic Resonance in Medicine", Vol.9 No.1(1989), Pages 86 to 89). The shield shown therein has a conductive plate consisting of a plurality of long, conductive plates 7a, . . . ,7a. Two adjacent plates 7a and 7a are overlapped to each other, and long capacitors are formed between the long overlapped parts of the plates 7a and 7a by inserting dielectrics 8, . . . ,8, respectively, thus the two adjacent plates 7a , . . . ,7a being connected with each other through the distributed-constant-type capacitor. In addition, lumped-constant-type chip capacitors 9, . . . ,9 are in parallel connected, between adjacent two plates 7a and 7a, with the distributed-constant-type capacitor. The chip capacitors 9 , . . . ,9 are for increasing capacitance between two adjacent plates 7a and 7a.

The impedance Z at the joint between two adjacent plates 7a and 7a is equivalent to a parallel network of a resistor R and a capacitor C shown in FIG. 3. When $\omega$ is an angular frequency, the impedance Z is represented by the following equation.

$$|Z| = R/(1+\omega^2.R.C)^{\frac{1}{2}}$$

As apparent from the equation, the capacitors according to the overlapping decrease the impedances at the respective plate joints in order to prevent eddy currents from being cut off, which generate the magnetic field for cancelling the RF magnetic field, as stated above.

However, there is a drawback in the shield of FIG. 2. The structure of each of the Joints is referred to as a monolayer capacitor (i.e., parallel-plate capacitor) using the overlapping of plates. In FIG. 4 showing the monolayer capacitor a reference numeral 7aa represents an adhesive layer, not counted as layers. There exists a physical limitation in increasing the area of pole plates (namely, the overlapped area). Also, taking reliability of insulation into consideration, there is a certain minimum in the distance between two pole plates (namely, the conductive plates 7a and 7a ). Hence, it is in fact impossible to increase largely the capacitances at the plate Joints, thereby the impedances thereat still remaining comparatively large.

Moreover, the auxiliary chip capacitors 9, . . . ,9 are placed at certain selected positions in a longitudinal direction of the overlapped capacitor, not all positions are in the longitudinal direction. Therefore, the attachment of the chip capacitors 9, . . . ,9 is not always effective in reducing capacitance at every part of each of the joints. This results in reduced high-frequency magnetic noises which should be be removed.

There is another drawback in the structure shown in FIG. 2. When the capacitors utilize the overlapping technique as stated, it is necessary to assemble thin conductive foils (pole plates) into the capacitors. Assembling the thin foils is liable to not only deteriorate the accuracy of processing, thus leading to unstable shielding effect, but gives lower efficiency of assembling.

SUMMARY OF THE INVENTION

Accordingly, it is a primary object of the present invention to provide an RF magnetic shield for magnetic resonance imaging in which rounding in waveform of gradient fields, which results from eddy currents of lower frequencies induced therein by generation of the gradient fields, is removed and higher-frequency magnetic shielding effect is increased.

It is a further object of the present invention to provide the shield in which processing is easy and a shielding property is stable.

To achieve the foregoing objects and in accordance with the purpose of the present invention, as embodied and broadly described herein, an RF magnetic shield for magnetic resonance imaging apparatus having a gradient coil and an RF coil allocated in a generally cylindrical magnet of the apparatus, the RF magnetic shield comprising: a conductive shielding plate member, disposed between the gradient coil and the RF coil, through which a slit element is formed; and a capacitor connected to both ends of the slit element, wherein the capacitor consists of a multilayer capacitor.

Preferably, the multilayer capacitor comprises a pair of pole plates disposed face to face, sub pole plates protruding from both the pole plates for the pole plate placed at the other sides, and a dielectric filled between a folded space formed by the pole plates and the sub pole plates. It is also preferred that the slit element consists of a plurality of slits formed into a long shape along an axial direction of the magnet. Further, each of the slits is formed through the shielding plate member in the axial direction.

It is also preferred that the multilayer capacitor is formed into a long shape, the entire axial length of the multilayer capacitor covering the axial length of the slits. The pole plates are continuously, electrically contacted to the longitudinal ends of the slits. Preferably, each group of the sub pole plates protruded from both the pole plates consists of a plurality of plates and the sub pole plates protruded from both the pole plates are positioned alternately to each other in a direction along the pole plates.

Preferably, the dielectric is low-loss dielectric material to an RF electrical field.

It is preferred that the conductive shielding plate member consists of a plurality of stacked metal plates. The stacked metal plates is at least three times larger in total thickness than a skin depth according to a frequency of an RF magnetic field generated by the RF coil

BRIEF DESCRIPTION OF THE DRAWINGS

The accompanying drawings which are incorporated in and constitute a part of this specification, illustrate embodiments of the present invention and, together with the description, serve to explain the principles of the present invention. Of the drawings:

FIG. 7 is a perspective view of the multilayer capacitor in FIGS. 4 and 5;

FIG. 8 is a graph showing a property of impedance at a slit versus frequency of eddy currents;

FIG. 9 is a graph for explaining a skin depth;

FIG. 10 is a perspective view of an RF magnetic shield according to another embodiment of the present invention;

FIG. 11 is a perspective view of slits of an RF magnetic shield according to still another embodiment of the present invention; and FIG. 12 is a partial perspective view of a multilayer capacitor of an RF magnetic shield according to still another embodiment of the present invention.

DESCRIPTION OF THE PREFERRED EMBODIMENTS

Figure 1:
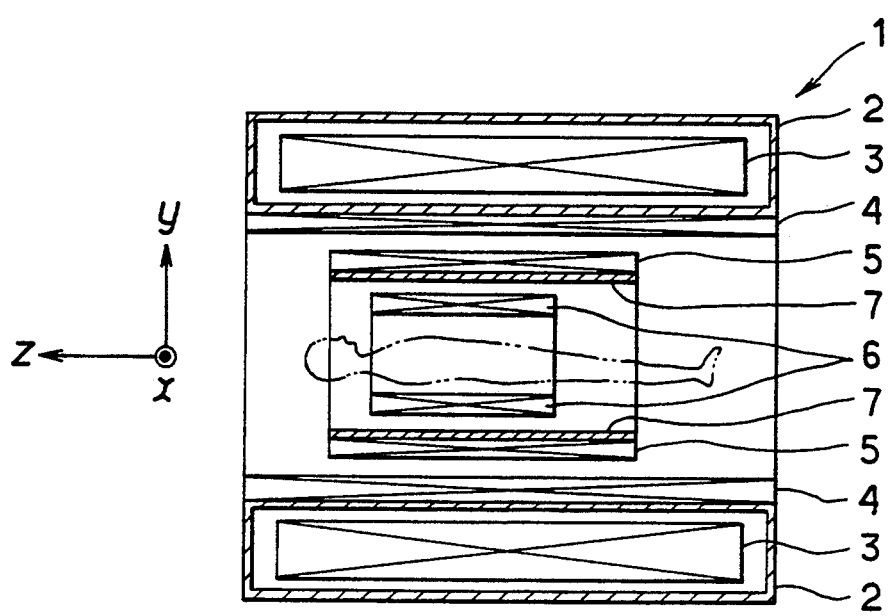
FIG. 1 is a cross sectional view of a superconductive magnet of an MRI apparatus according to a prior art.

Reference will now be made in detail to the preferred embodiments of the present invention, examples of which are illustrated in the accompanying drawings.

An embodiment will now be described according to FIGS. 5 to 9. The same reference numerals as in FIG. 1 are used for the same components as ones described therein, omitting their explanation for simplicity.

Figure 5:
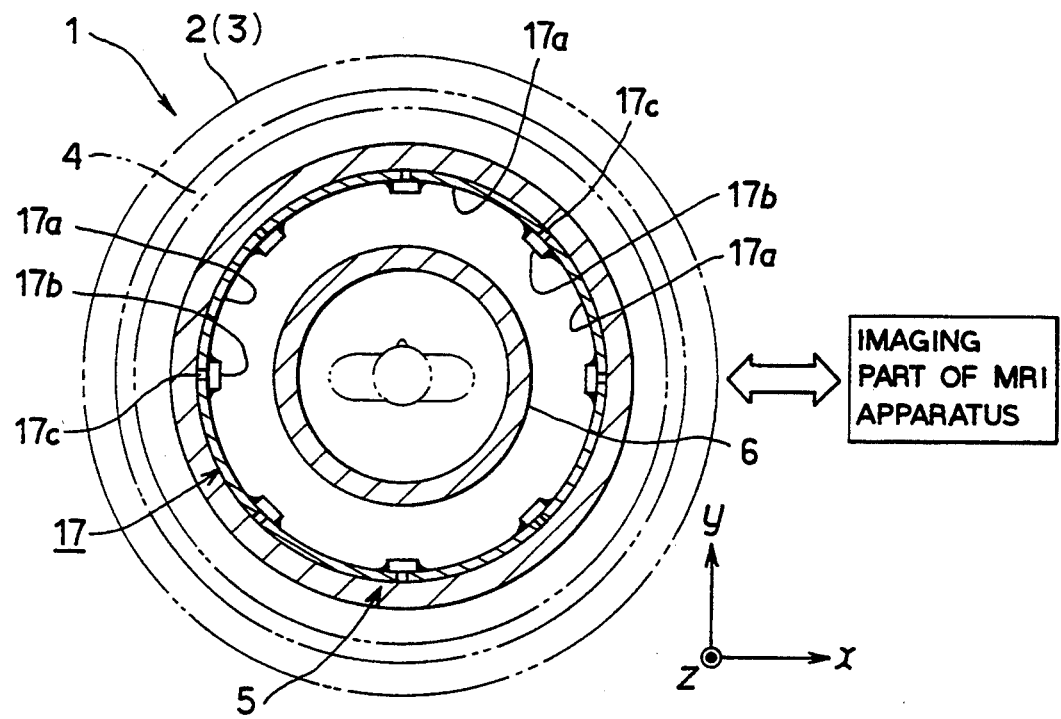
FIG. 5 is a transverse sectional view of an RF magnetic shield installed in a superconductive magnet of an MRI apparatus of an embodiment according to the present invention.

FIG. 5 shows a transverse cross section cut perpendicularly to an axial z-direction of the superconductive magnet 1 shown in FIG. 1. Referring now to FIG. 5, it may be seen that an RF magnetic shield 17 is placed between a gradient coil 5 and an RF coil 6, and the RF magnetic shield 17 is attached to the inner wall of the gradient coil 5. When viewed along the axial z-direction of the magnet 1, the RF magnetic shield 17 is formed to be multi-divided structure. An inner space of the RF coil 6 is used for diagnosis.

The RF magnetic shield 17 comprises a plurality of shielding plates 17a, . . . ,17a. Each of the shielding plates 17a, . . . ,17a, made of stacked plural copper foils, consists of a long copper foil, and adheres to the inner wall of the gradient coil 5 so as to form a cylindrical shape as a whole, but a certain distance apart from each other in its circumferential direction, thus creating a plurality of slits 17c, . . . ,17c therebetween extending in the axial z-direction.

Figure 6:
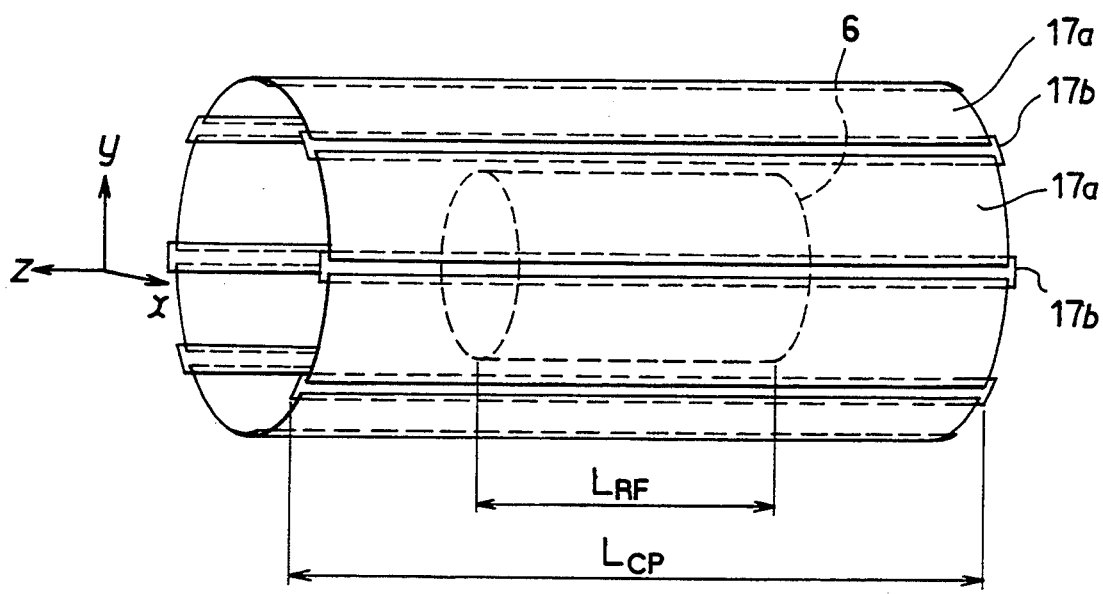
FIG. 6 is a perspective view for explaining a positional relation between slits and multilayer capacitors in the RF magnetic shield.

At the respective positions of the slits 17c, . . . , 17c, a plurality of multilayer capacitors 17b, . . . ,17b are arranged so as to entirely cover the longitudinal length (i.e., length in the axial z-direction) of the respective slits 17b, . . . ,17b, as shown in FIG. 6. The longitudinal length $L_{CP}$ of the slits 17c, . . . ,17c is of course larger than the longitudinal length $L_{RF}$ of the RF coil contained therein.

Each of the multilayer capacitors 17b, . . . ,17b, as shown in FIG. 7, has a comb-like cross section cut along a transverse x-y plane orthogonal to the longitudinal(axial) z-direction. The respective multilayer capacitors 17b, . . . ,17b have a pair of pole plates 21 and 22, each being formed into a long shape having a given length corresponding to the length of the slits 17c, . . . ,17c. The bottom and top of the pole plates 21 and 22 are bent perpendicularly inward. The pole plates 21 and 22 are placed to stand up at the longitudinal ends of the shielding plates 17a and 17a, respectively, and the outer side of the pole plates 21 and 22 and the shielding plates 17a and 17a are individually coupled by means of soldering (soldering portions are represented by references 26). Thus, longitudinally continuous electrical contact between the shielding plates 17a and 17a and the pole plates 21 and 22 are ensured over one end of each of the slits 17c, . . . ,17c to another in the longitudinal z-direction.

From one pole plate 21, a plurality of sub pole plates 23a, . . . ,23a are protruded inward at a right angle, certain distances apart in the height y-direction. In the same manner, a plurality of sub pole plates 24a, . . . ,24a are protruded from the other pole plate 22, but the positions of the sub pole plates 24a, . . . ,24a are different from those of the sub pole plates 23a, . . . ,23a and are positioned alternately in the height y-direction. Accordingly, as shown in FIG. 7, the combination of both the sup pole plates 23a, . . . ,23a and 24a, . . . ,24a makes the comb-like structure of plates.

In this embodiment, the pole plates 21 and 22 and the sub pole plates 23a, . . . ,23a and 24a, . . . ,24a are each made of rolled copper foil of 35 [μm] in thickness. Each of the two groups of the sub pole plates 23a, . . . ,23a and 24a, . . . ,24a consists of six plates and their distances equally devided in the height y-direction is formed to be 60 [μm].

Among the sub pole plates 23a, . . . ,23a and 24a, . . . ,24a, two each sub plates 23a, 23a and 24a, 24a positioning at the top and bottom of each multilayer capacitor 17b are exposed without resist or conduction, and additionally enforces the dielectric 25. The outer sides of the pole plates 21 and 22 are conductive.

The multi-folded space formed among the sub pole plates 23a, . . . ,23a and 24a, . . . ,24a are filled with dielectric 25. The dielectric 25 consists of low-loss materials, such as a Teflon, a Teflon mixed with ceramic powder or a ceramic material, having a dielectric constant $\epsilon_r$ of appro. 2 to 10, a dielectric loss angle tan δ of 0.0008 (when 10 GHz of frequency). In the present invention, when the loss of the dielectric 25 is discussed against an RF electrical field, the same loss as the Teflon or less loss than the Teflon is defined to as "low-loss".

Each of the multilayer capacitors 17b, . . . ,17b thus-constructed provides a nine-layer structure of the dielectric 25; the thickness of each layer is 60 [μm], the width is 25 [mm], and the longitudinal length is 500 [mm], thus the entire thickness being appro. 0.9 [mm] (=60×9+35×10).

Since the multilayer capacitors 17b, . . . ,17b are each contacted on both longitudinal ends of the slits 17c, . . . ,17c, each of the multilayer capacitors 17b, . . . ,17b functions as a distributed-constant-type capacitor. But, for unit length in the longitudinal z-direction, each multilayer capacitor 17b can be equivalently with lumped-constant-type capacitors. The capacitance per unit length of each multilayer capacitor 17b is selected in order that the impedance of each slits 17c is, as shown in FIG. 8, small enough to the eddy currents of a high frequency $f_H$ and large enough to the eddy currents of low frequency $f_L$.

The total thickness of each shielding plate 17a is designed to be three times larger or more than a skin depth defined by the frequency $f_0$ (i.e., Larmor frequency) of the RF magnetic field generated by the RF coil 6. The skin depth u is represented by the following equation;

$$u=(2/\omega\sigma\mu)^{\frac{1}{2}}$$

wherein μ is the magnetic permeability of a conductive material, σ is the electric conductivity of the conductive material, ω is an angular frequency ($2\pi f_0$). As can be seen from the equation, when a plane wave as an electromagnetic wave is admitted onto the conductive material, it is understood that the amplitude of the plane wave decays exponentially in the conductive material. FIG. 9 represents the decay curve, in which the amplitude of the plane wave at or after the depth "3u" is reduced down to appro. 5% or less in amplitude, which is sufficient values for the decay of the plane wave.

Now, the capacitance per unit length of each multilayer capacitor 17b will be calculated. When assuming that the multilayer capacitor 17b is a parallel-plate capacitor, the area S of the parallel plates and the distance d of the parallel plates are approximately as follows.

$$S=(21+23\times 7)\times 1 \div 1000=0.182[m^2]$$

$$d=0.06 \div 1000=6\times 10^{-5}[m]$$

If a dielectric constant $\epsilon_r$ is appro. 2.1, then the capacitance C is appro. as follows.

$$C=56406[pF/m] \quad (1)$$

Figure 4:
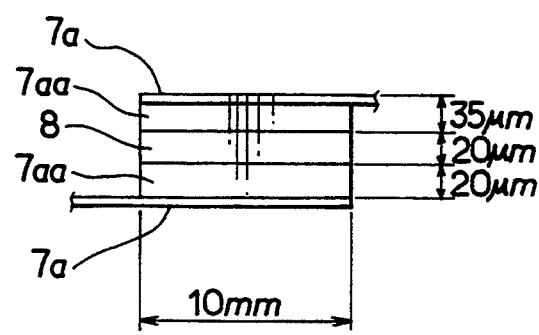
FIG. 4 is an enlarged side view of the overlapped capacitor of FIG. 2.

Let us compare the calculated capacitance C to the conventional one according to the monolayer construction shown in FIG. 4. In the monolayer capacitor shown therein, the conductive plate 7a is made of copper strip (longitudinal length 80 [mm], thickness 18 [μm], and adhesive thickness 35 [μm]). The dielectric 8 is made of Teflon (longitudinal length 90 [mm], width 10 [mm], thickness 20 [μm], and adhesive thickness 20 [μm]). The upper and lower conductive plates are overlapped with each other by 10 [mm]. When the dielectric constant $\epsilon_r$ of the adhesive is assumed to be $\epsilon_r=2.3$, which is the same value as Teflon, the capacitance $C_0$ per unit length of the monolayer capacitor is appro. given by $$C_0=8.855\times 10^{-12}.\epsilon_r.S/d.$$

S is the area of the parallel plates and d is the distance between the parallel plates, those of which are given as follows.

$$S=1\times 10^{-2}[m^2]$$

$$d=(35+20+20)\times 10^{-6}=7.5\times 10^{-5}[m]$$

Therefore, the capacitance $C_0$ is given as $$C_0=2716 \; [pF/m]. \quad (2)$$

Comparing both the capacitances of the equations (1) and (2), it is clearly understood that the capacitance of the multilayer capacitor 17b is appro. twenty-one times larger than the one according to the conventional monolayer capacitor.

Thus, for the eddy currents of higher frequencies (63.9 MHz is used, for instance), the impedance Z at each slit joint of the present embodiment is found as follows.

$$|Z|=|1/j.\omega.C|=0.044 \; [\Omega/m] \quad (3)$$

In contrast, the impedance $Z_0$ per unit length according to the conventional monolayer capacitor of FIG. 4 is given by $$|Z_0|=|1/j.\omega.C_0|=0.9160 \; [\Omega/m]. \quad (4)$$

comparison between the capacitances Z and $Z_0$ shows that the impedance at each slit 17c according to the embodiment is greatly reduced for the eddy currents of higher frequencies. The multilayer capacitors 17b, . . . ,17b are made of low-loss dielectric 25, thus the eddy currents of higher frequencies flowing across the slits 17c, . . . ,17c, without their currents being cut down. This ideal current flow across the the slits 17c, . . . ,17c surely provides sufficient and stable shielding effect to the RF magnetic field.

In other words, RF noises transmitting to the RF coil 6 through the gradient coil 5 are substantially reduced. The Q factor of the RF coil 6, which is reflected by the magnetic coupling of the gradient coil 5 and the RF coil 6, has not almost reduced, maintaining a high value designated by design. Therefore, a signal to noise ratio is increased far more than the conventional monolayer capacitor technique.

Further, the impedance of each multilayer capacitor 17b represents a sufficiently large value to the eddy currents of lower frequencies at each slit joint. This gets rid of rounding of waveforms of gradient field generated by the gradient coil 5, thereby surely preventing images from being distorted.

As have been stated so far, the three requirements to the RF magnetic shield 17 are fully satisfied at the same time.

Moreover, the RF magnetic shield 17 thus-constructed has a wide variety of advantages. Each multilayer capacitor 17b covers the entire longitudinal length of each slit 17c. In addition, the total thickness of each shielding plate 17a is more than three times of the skin depth. This combination of structure permits elecromagnetic waves transmitted from outer field to decay down to negligible level, thus providing sufficient shielding effect. The multilayer structure of the sub pole plates helps to maintain the high and stable shielding effect.

Each multilayer capacitor 17b provides distributed-constant-type capacitance, because the capacitor 17b is a sheet-like and is continuously and uniformly contacted with the slit 17c at its longitudinal ends. Namely, any current path in the longitudinal z-direction of each slit 17c represents a reduced and equal impedance, and when the capacitor 17b is assembled, no changes in shielding effect will occur in differences in longitudinal position. This eliminates the need for excessive care to longitudinal positioning of the capacitors 17b, . . . ,17b which had been seen in the prior art, thus making it easy the assembly process of the capacitors 17b, . . . ,17b. In addition, the troublesome overlapping prosess is not necessary. Accordingly, it is possible to increase efficiency of assembling. It is also possible to hold higher the manufacturing accuracy.

It will be apparent to those skilled in the art that various modifications and variations could be made in the RF magnetic shield of the present invention without departing from the scope or spirit of the present invention. FIGS. 10 to 12 show such variations.

FIG. 10 represents a variation for multilayer capacitors 17b, . . . ,17b. The multilayer capacitors 17b, . . . ,17b adopted in the foregoing embodiment have a full length over each of the slits 17c, . . . ,17c (refer to FIG. 6). But, in the variation of FIG. 10, there provided are multilayer capacitors (longitudinal length $L_{Cp}$) shorter than the slits 17c, . . . ,17c, but longer than the longitudinal length $L_{RF}$ (i.e., $L_{CP} > L_{RF}$). The multilayer capacitors 17b, . . . ,17b still fully cover the axial length part of the RF coil 6. Because the eddy currents of higher frequencies flow in a symmetric pattern with the shape of the RF coil 6 in the shield 17, the multilayer capacitors 17b, . . . ,17b are able to give paths for the eddy currents of higher frequencies. Accordingly, such advantages described in the foregoing embodiment can also be obtained.

When extending this concept for a saddle-type RF coil, multilayer capacitors may be shortened to a miminum of longitudinal length covering only narrow paths through which the higher frequency eddy currents flow along the symmetric saddle pattern in an RF magnetic shield.

Figure 2:
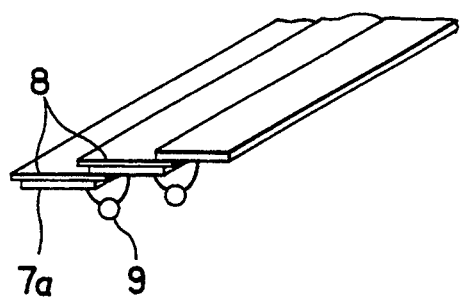
FIG. 2 is a perspective view of overlapped capacitors according to a prior art.
Figure 3:
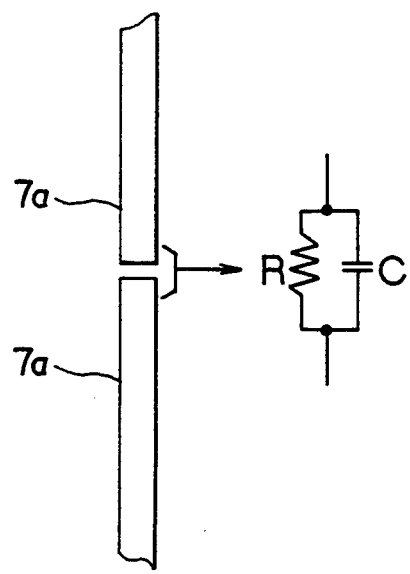
FIG. 3 is a pictorial explanation for an equivalent electrical circuit of the overlapped capacitor of FIG. 2.

FIG. 11 represents a variation for forming slits 17c, . . . ,17c through and across the shielding plate 17a. That is, in the present invention, slits may be formed in any pattern such as shown in FIG. 11, provided that symmetry in regard to an x-y plane, a y-z plane, and a z-x plane is maintained and slits are formed such that a time constant of eddy currents is short enough than a rise time of gradient fields. Several other examples of slits, which may be applied to the present invention, are shown in FIGS. 3 and 6 of U.S. Pat. No. 4,642,569 and in FIG. 2 of "R. J. Ordidge et al, "Snapshot Imaging at 0.5T Using Echo-Planer Technique", MAGNETIC RESONANCE IN MEDICINE 10, 227–240 (1989). Slits, whose both ends or one end are connected, may also be used, if necessary.

Further, FIG. 12 represents a variation of the entire structure of the multilayer capacitor 17b, in which the folded dielectric 25 is disposed in a perpendicular direction to the shielding plates 17a and 17a by combination of the pole plates 21 and 22 and the sub pole plates 23a, . . . ,23a and 24a, . . . ,24a.

What is claimed is:

1. An RF magnetic shield for a magnetic resonance imaging apparatus having a gradient coil and an RF coil, the gradient coil and the RF coil each having a length direction and an axis along the length direction with the axis of the gradient coil and the RF coil coaxially aligned, the RF magnetic shield comprising:

a cylindrically shaped conductive shielding sheet means, having an axis aligned with said axis of the gradient coil and the RF coil, and disposed, therebetween, said shielding sheet means having a slit having a length along said axis direction and a width, perpendicular to the length, with said length longer than said width; and a multilayer capacitor covering at least a part of the slit along the length of the RF coil and covering the slit along the width thereof and being connected to said shielding sheet means.

2. The RF magnetic shield according to claim 1, wherein said multilayer capacitor comprises two pole plates facing one another, a plurality of sub pole plates connected to each of the pole plates and extending to the other pole plate, forming a stack of spaced apart sub pole plates, with alternate sub pole plates of said stack connected to one pole plate, and a dielectric material filling a space formed by the pole plates and the sub pole plates.

3. The RF magnetic shield according to claim 2, wherein said shielding sheet means has a plurality of slits each having a length along said axis direction and a width, perpendicular to the length, with said length longer than said width.

4. The RF magnetic shield according to claim 3, wherein each of said plurality of slits is formed along the entire length of the shielding sheet means.

5. The RF magnetic shield according to claim 1, wherein said multilayer capacitor is formed along the entire length of the slit.

6. The RF magnetic shield according to claim 2, wherein said pole plates and sub pole plates extended along the entire length of the slit.

7. The RF magnetic shield according to claim 6, wherein each of said pole plates is continuously, electrically connected to said shielding sheet means along the entire length of the slit.

8. The RF magnetic shield according to claim 4, further comprising a plurality of multilayer capacitors, each capacitor covering at least a part of one of said plurality of slits along the length of the RF coil and covering said one of said plurality of slits slit along the width thereof and being connected to said shielding sheet means.

9. The RF magnetic shield according to claim 2, wherein said dielectric material has low-loss operating in an RF electric field.

10. The RF magnetic shield according to claim 2, wherein said conductive shielding sheet means consists of a plurality of stacked metal foils.

11. The RF magnetic shield according to claim 10, wherein said stacked metal foils are at least three times larger in total thickness than a skin depth according to a frequency of an RF magnetic field generated by the RF coil.

12. The RF magnetic shield according to claim 7, wherein said two pole plates are positioned perpendicular to the conductive shielding sheet means.

13. The RF magnetic shield according to claim 7, wherein said two pole plates are positioned parallel to the conductive shielding sheet means.

14. The RF magnetic shield according to claim 7, wherein said conductive shielding sheet means consists of a plurality of stacked metal foils disposed on the inner circumferential wall of the gradient coil.

15. An RF magnetic shield for a magnetic resonance imaging apparatus having a gradient coil and an RF coil, the gradient coil and the RF coil each having a length direction and an axis along the length direction with the axis of the gradient coil and the RF coil coaxially aligned, the RF magnetic shield comprising:

a plurality of laterally spaced apart single layer conductive shielding sheets formed in a substantially cylindrical shape having an axis aligned with said axis of the gradient coil and the RF coil and disposed therebetween, wherein two immediately adjacent laterally spaced apart shielding sheets define a slit therebetween, said slit having a length along said axis direction and a width, defined by the separation between said two sheets, with said length longer than said width; and a plurality of multilayer capacitors, each capacitor electrically connected to two adjacent shielding sheets positioned to cover the slit therebetween, along the width thereof, and along the length of the RF coil.

* * * * *